United States Patent
Pallesgaard

(10) Patent No.: US 12,327,674 B2
(45) Date of Patent: *Jun. 10, 2025

(54) MAGNETICALLY IMMUNE GATEDRIVER CIRCUIT

(71) Applicant: VESTAS WIND SYSTEMS A/S, Aarhus N. (DK)

(72) Inventor: Stig Lund Pallesgaard, Løgstrup (DK)

(73) Assignee: VESTAS WIND SYSTEM A/S, Aarhus N (DK)

( * ) Notice: Subject to any disclaimer, the term of this patent is extended or adjusted under 35 U.S.C. 154(b) by 327 days.

This patent is subject to a terminal disclaimer.

(21) Appl. No.: 17/939,635

(22) Filed: Sep. 7, 2022

(65) Prior Publication Data

US 2023/0005660 A1    Jan. 5, 2023

Related U.S. Application Data

(63) Continuation of application No. 16/142,839, filed on Sep. 26, 2018, now Pat. No. 11,501,913.

(30) Foreign Application Priority Data

Oct. 3, 2017 (DK) .............................. PA201770751

(51) Int. Cl.
*H01F 17/04*     (2006.01)
*H01F 17/06*     (2006.01)
(Continued)

(52) U.S. Cl.
CPC ............ *H01F 27/34* (2013.01); *H01F 17/06* (2013.01); *H01F 19/08* (2013.01); *H01F 27/24* (2013.01);
(Continued)

(58) Field of Classification Search
CPC ...................................................... H01F 27/34
(Continued)

(56) References Cited

U.S. PATENT DOCUMENTS 1,882,773 A * 10/1932 Callsen ................ H01F 27/427
                                                          336/155
2,640,960 A *  6/1953 Force ................... H01F 38/085
                                                          336/215

(Continued)

FOREIGN PATENT DOCUMENTS

DE            2551179 A1      8/1976
EP            2071596 A2      6/2009

(Continued)

OTHER PUBLICATIONS

Danish Patent and Trademark Search Report and Opinion for Application No. PA 2017 70751 dated May 3, 2018.

(Continued)

*Primary Examiner* — Ronald Hinson
(74) *Attorney, Agent, or Firm* — Patterson + Sheridan, LLP

(57) ABSTRACT

An electric power converter includes an electric gatedriver circuit that includes a transformer. The transformer includes separate first and second cores of magnetically conductive material that are shaped to form respective closed loops. The transformer also includes a first electrical conductor with at least one winding arranged around a part of the first core in a first winding direction and at least one winding arranged around a part of the second core in a second winding direction opposite the first winding direction. The transformer further includes a second electrical conductor with at least one winding arranged around a part of the first core in the first winding direction and at least one winding arranged around a part of the second core in the second winding direction so as to counteract electric influence induced by a (Continued)

common magnetic field through the closed loops of the first and second cores.

11 Claims, 3 Drawing Sheets

(51) Int. Cl.
  *H01F 19/08*    (2006.01)
  *H01F 27/24*    (2006.01)
  *H01F 27/32*    (2006.01)
  *H01F 27/34*    (2006.01)
  *H01F 27/38*    (2006.01)
  *H03K 17/16*    (2006.01)
  *H03K 17/691*    (2006.01)
  *H01F 38/00*    (2006.01)

(52) U.S. Cl.
  CPC ........... *H01F 27/323* (2013.01); *H01F 27/38* (2013.01); *H03K 17/168* (2013.01); *H03K 17/691* (2013.01); *H01F 2019/085* (2013.01); *H01F 2038/006* (2013.01)

(58) Field of Classification Search
  USPC .................................................. 336/200, 229
  See application file for complete search history.

(56) References Cited

U.S. PATENT DOCUMENTS

| | | | |
|---|---|---|---|
| 3,748,570 A | | 7/1973 | Martner |
| 4,229,721 A | * | 10/1980 | Koloczek ............ H01F 27/2455 336/212 |
| 4,896,091 A | | 1/1990 | Kislovski |
| 5,525,951 A | * | 6/1996 | Sunano ................. H02M 1/126 336/215 |
| 7,414,507 B2 | | 8/2008 | Giandalla et al. |
| 7,724,118 B1 | * | 5/2010 | Chen ....................... H01F 19/08 336/229 |
| 8,970,000 B2 | | 3/2015 | Kerber et al. |
| 9,618,541 B1 | * | 4/2017 | Nguyen ................ G01R 15/183 |
| 9,831,925 B2 | * | 11/2017 | Dolgin ..................... H01Q 3/34 |
| 2002/0175571 A1 | | 11/2002 | Gilmore et al. |
| 2004/0140879 A1 | | 7/2004 | Schafer |
| 2006/0186981 A1 | | 8/2006 | Jang et al. |
| 2007/0040644 A1 | | 2/2007 | Jang et al. |
| 2007/0205748 A1 | | 9/2007 | Abou |
| 2008/0266042 A1 | | 10/2008 | Yoshimura et al. |
| 2009/0230776 A1 | * | 9/2009 | Ochi ....................... H01F 27/38 29/605 |
| 2010/0254168 A1 | * | 10/2010 | Chandrasekaran ..... H01F 30/06 336/170 |
| 2011/0248812 A1 | * | 10/2011 | Hu ........................ H01F 29/14 336/221 |
| 2013/0033351 A1 | * | 2/2013 | Kim ....................... H01F 27/38 336/170 |
| 2017/0104469 A1 | | 4/2017 | Mavretic |

FOREIGN PATENT DOCUMENTS

| | | |
|---|---|---|
| EP | 2302798 A1 | 3/2011 |
| WO | 2014182818 A1 | 11/2014 |

OTHER PUBLICATIONS

Extended European Search Report for Application No. 18195955.2-1212 dated Mar. 28, 2019.

* cited by examiner

MAGNETICALLY IMMUNE GATEDRIVER CIRCUIT

CROSS-REFERENCE TO RELATED APPLICATIONS

The present disclosure claims benefit of and priority to U.S. patent application Ser. No. 16/142,839 filed Sep. 26, 2018, which claims priority to Danish Patent Application No. PA 2017 70751 filed Oct. 3, 2017. Each of the aforementioned applications are herein incorporated by reference in their entireties.

FIELD OF THE INVENTION

The present invention relates to the field of power converters, more specifically for circuits for control of power converters e.g. in wind turbines.

BACKGROUND OF THE INVENTION

Electric control signals for control of power switching circuits, gatedrive circuits, e.g. in a wind turbine, is normally transferred via galvanic separation means. The signals can e.g. be transferred via a traditional 1:1 electric transformer to provide galvanic separation. Such transformer will normally be located inside the converter cabinet, and thus inside the power stack where it is a part of the gatedriver, driving an IGBT module.

In a wind turbine with an electric power of several MW, the environment inside the converter cabinet is influence by a strong magnetic radiation due to large currents running through the busbars, generating a surrounding magnetic field. There will also be stray magnetic fields around reactors in the converter, and finally EMI is generated by the commutation of the power modules. Very high currents processed in a MW converter in the busbars and components at switching frequencies of up to typically 10 kHz will generate strong fields which are picked up by the gatedriver transformer. This will lead to a wrong signal level transfer over the galvanic barrier of the gatedriver, thus distorting the control signals, which again may cause errors in the control function of the power electronic switches of the converter. In worst case scenarios this may lead to a cross conduction of the IGBT, if there is no other systems in place to secure this cannot happen, on the high voltage side of the gatedriver.

SUMMARY OF THE INVENTION

Thus, according to the above description, it is an object of the present invention to provide a device and method for providing a magnetically immune galvanic separation for use in high power gatedrivers, e.g. for use in the control of an electric power converter of a wind turbine.

In a first aspect, the invention provides a gatedriver circuit arranged to generate an electric control signal output for controlling switching of a power electronic switch, the gatedriver circuit comprising a transformer arranged to receive an electric control signal at its electric input and to transform the electric control signal to the electric control signal output at its electric output, wherein the transformer provides a galvanic separation between its electric input and output, and wherein the transformer comprises separate first and second cores of magnetically conductive material, wherein each of the first and second cores are shaped to form respective closed loops, a first electrical conductor forming the electric input, wherein the first electrical conductor has at least one winding arranged around a part of the first core and at least one winding arranged around a part of the second core, a second electrical conductor forming the electric output, wherein the second electrical conductor has at least one winding arranged around a part of the first core and at least one winding arranged around a part of the second core, wherein the first core is positioned in relation to the second core so as to allow mutual magnetic interaction between the first and second cores, and wherein the windings of the first and second electrical conductors around the first core have the same winding direction, and wherein the windings of the first and second electrical conductors around the second core have opposite winding direction of the windings of the first and second electrical conductors around the first core, so as to counteract electric influence induced by a common magnetic field through the closed loops of the first and second cores.

Such gatedriver circuit is advantageous, since it allows galvanic separation which is highly immune towards strong magnetic fields which may disturb signal transfer using a traditional transformer. By the use of two separate cores and the opposite winding directions, the influence of magnetic fields on the control signal can be eliminated or at least significantly reduced, thereby allow the gatedriver circuit to function also in environments with strong magnetic fields.

Thus, such gatedriver circuit can be used in high power applications, such as for control of power electronic switches in an electric converter for powers of 1 MW or more, e.g. for large wind turbines, without functional problems due to magnetic interference with gatedriver control signals. Still, this galvanic separation can be obtained by the use of simple components.

Even further, the gatedrive circuit according to the first aspect has the advantage that a traditional transformer can be replacement with the transformer of the invention without any further modification of the transmitter and receiver circuits.

It has been found that a suppression of magnetic influence of 10-20 dB, or even more than 20 dB can be achieved.

In the following, preferred embodiments and features of the gatedriver circuit will be described.

Preferably, the first conductor has the same number of windings around the first and second cores, and the second conductor preferably also has the same number of windings around the first and second cores. This will provide the most effective cancelling of the magnetic influence.

The first and second cores may have identical geometrical shapes, or they may have different shapes, e.g. they may have similar geometrical shapes but with different size. In a preferred embodiment, both of the first and second cores have toroid shapes, e.g. the two toroids may be identical, and they may be stacked, i.e. with the first core positioned on top of the second core. The toroids may have an outer diameter of such as 1-20 cm, such 2-10 cm.

In some embodiments, the first and second cores have different sizes, but have, e.g. the same geometrical shape, thereby enabling that the first core to be positioned inside the closed loop of the second core.

The first and second cores may be made of a ferrite material. However, other materials known to be used for transformer core material may be used.

The first electrical conductor may have 2-50 windings arranged around a part of the first core and 2-50 windings arranged around a part of the second core. Likewise, the second electrical conductor has 2-50 windings arranged around a part of the first core and 2-50 windings arranged around a part of the second core. The transformer may be designed to provide a voltage transformation ratio of 0.5 to 2.0 from its electric input to its electric output. Especially, the number of windings of the first and second electrical conductors are equal or substantially equal, so as to provide a voltage ratio of 0.8-1.2, such as 10-20 windings of each of the first and second electrical conductors so as to provide a voltage ratio of 1.0.

It is to be understood that the first and second electrical conductors are preferably electrically insulated wires, such as copper wires or wires of other electrically conductive materials.

Preferably, the gatedriver circuit comprises a transmitter circuit connected to the first electrical conductor and a receiver circuit connected to the second electrical conductor. The transmitter circuit may especially be arranged to generate an electric control signal with a frequency within the interval 10 kHz to 5 MHz. Especially, the electric control signal may be a series of impulse signals.

In a second aspect, the invention provides an electric power converter comprising a plurality of power electronic switches controlled and an electric gatedriver circuit according to the first aspect for controlling the plurality of power electronic switches. Especially, the gatedriver circuit is arranged to generate the electric control signal output to control the plurality of power electronic switches at a switching frequency of below 10 kHz.

The power converter may especially comprise an insulated gate bipolar transistor (IGBT) module, wherein the gatedriver circuit is arranged to control switching of the IGBT module. Alternatively, or additionally, the power electronic switches may include one or more of: mosfet, GTO, IGCT, and/or comprises power electronic switches based on silicon carbide (SiC) technologies.

Especially, the power converter may be dimensioned to convert electric power of at least 1 MW, such as 2-10 MW or more.

In a third aspect, the invention provides a wind turbine comprising a gatedriver circuit according to the first aspect, or an electric power converter according to the second aspect. Especially, the wind turbine may comprise a power converter comprising an IGBT module, and wherein the gatedriver circuit is arranged to control switching of the IGBT module. Especially, the wind turbine may comprise an electric power generator arranged to generate an electric power of at least 1 MW, such as 2-10 MW or more. In such MW wind turbines, the gatedriver circuit and thus also the galvanic separation, is present close to the switching currents of thousands of amperes, and thus for such size wind turbines, the gatedriver circuit according to the invention can significantly improve the quality of the transferred control signals.

In a third aspect, the invention provides a method for providing a galvanic separation of an electric gatedriver control signal for controlling switching of a power electronic switch, the method comprising providing a transformer arranged to receive an electric control signal at its electric input and to transform the electric control signal to the electric control signal output at its electric output, the providing of the transformer comprising providing separate first and second cores of magnetically conductive material, wherein each of the first and second cores are shaped to form respective closed loops, providing a first electrical conductor forming the electric input, wherein the first electrical conductor has at least one winding arranged around a part of the first core and at least one winding arranged around a part of the second core, providing a second electrical conductor forming the electric output, wherein the second electrical conductor has at least one winding arranged around a part of the first core and at least one winding arranged around a part of the second core, and positioning the first core in relation to the second core so as to allow mutual magnetic interaction between the first and second cores, and wherein the windings of the first and second electrical conductors around the first core have the same winding direction, and wherein the windings of the first and second electrical conductors around the second core have opposite winding direction of the windings of the first and second electrical conductors around the first core, so as to counteract electric influence induced by a common magnetic field through the closed loops of the first and second cores.

It is to be understood that the same advantages and preferred embodiments and features apply for the second, third and fourth aspects, as described for the first aspect, and the aspects may be mixed in any way.

BRIEF DESCRIPTION OF THE FIGURES

The invention will now be described in more detail with regard to the accompanying figures of which

The figures illustrate specific ways of implementing the present invention and are not to be construed as being limiting to other possible embodiments falling within the scope of the attached claim set.

DETAILED DESCRIPTION OF THE INVENTION

The gatedriver circuit according to the invention is advantageous for wind turbines, e.g. wind turbines capable of generating high electric power such as more than 1 MW. However, it is to be understood that the invention may be other power electric applications, especially where operation of power electronic switches are controlled by control signals in an environment involving strong magnetic fields.

Figure 1:
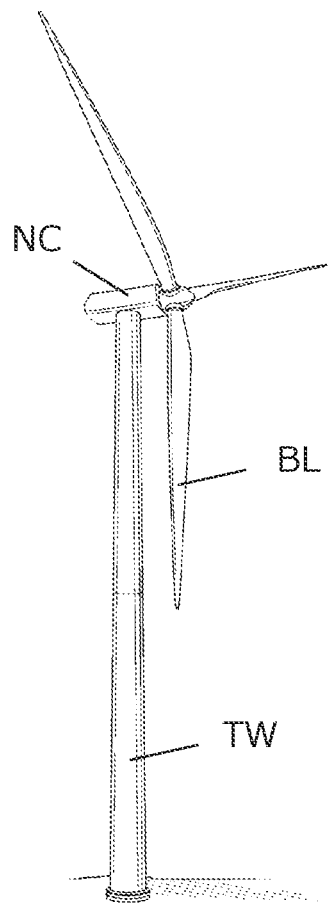
FIG. 1 illustrates a wind turbine, in which the gatedriver circuit of the invention is advantageous.

FIG. 1 illustrates a wind turbine with three rotor blades for driving an electric generator located inside the nacelle on top of a tower. Typically, the electric power converter in a wind turbine can be placed up-tower or down tower. The full scale converter typically comprises a power stack for AC/DC conversion and a power stack for DC/AC conversion. Furthermore the converter system comprises reactors, filter capacitors, breakers, busbars and other converter related systems. The gatedriver circuit with the galvanic separation transformer according to the invention will normally be located inside the converter cabinet, inside the power stack where it is a part of the gatedriver, driving power electronic switches in the form of an IGBT module. Strong magnetic fields are present inside the converter, due to large currents, e.g. thousands of amperes, running through the busbars, generating surrounding magnetic field. There will also be stray magnetic fields around reactors in the converter. Further, EMI is generated by the commutation of the power.

Figure 2:
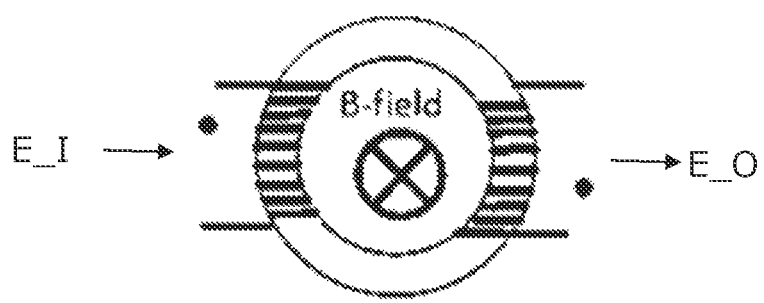
FIG. 2 illustrates a prior art galvanic separation transformer.

FIG. 2 shows an example of a traditional toroid transformer for providing galvanic separation in the transfer of control signals, typically impulse signals in the frequency range 10 kHz to 5 MHz, for controlling of switching of power electronic switches of the electric power converter which operate at a switching frequency of up to 10 kHz, e.g. 1 kHz to 10 kHz. Here, a primary winding around a part of the toroid core serves to receive an electric input signals E_I and generate a corresponding electric output signal E_O at a secondary winding. However, a magnetic field B will induce a voltage in the secondary winding which will influence the electric output signals E_O, and thus makes the signal transfer susceptible to external magnetic air flux field. This can lead to errors in the control signals, and generate a false turn on of the power electronic switches in the connected power module if not handled properly.

Figure 3:
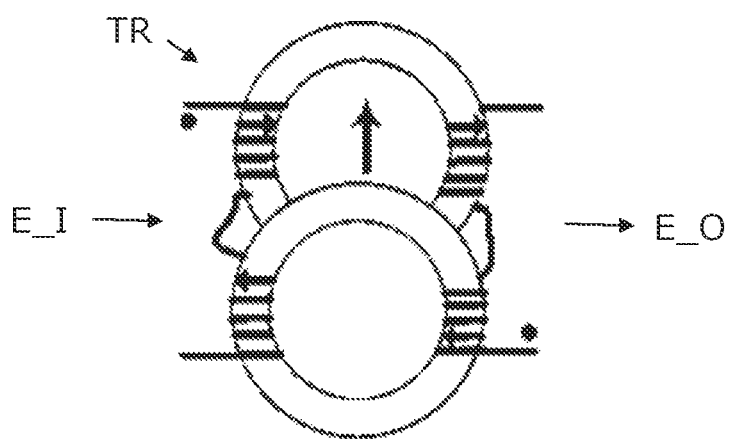
FIG. 3 illustrates the principle of the magnetically immune transformer of the invention.

FIG. 3 shows an embodiment of the transformer for the gatedriver circuit according to the invention. In this embodiment, two separate identical toroid cores of magnetically conductive material are wound by a first electrical conductor forming an electric input E_I, and a second electrical conductor forms an electric output E_O. The first electrical conductor has windings arranged around a part of the first core and windings arranged around a part of the second core. The second electrical conductor has windings arranged around a part of the first core and at least one winding arranged around a part of the second core.

The winding directions are indicated on the conductors with arrows, and the first and second electrical conductors around the first core have the same winding direction, and wherein the windings of the first and second electrical conductors around the second core have opposite winding direction of the windings of the first and second electrical conductors around the first core. In operation, the two cores are positioned so as to allow mutual magnetic interaction between the first and second cores, i.e. the two cores are placed near each other to provide a high mutual magnetic interaction.

With the proposed winding directions, electric influence induced by a common magnetic field through the closed loops of the first and second cores is counteracted, and the magnetic field that would enter the center part of the toroid will generate zero volt on the output E_O. Preferably, the first conductor has equal number of windings around the first and second toroid, and the second conductor has equal number of windings around the first and second toroid, so as to provide the most effective cancelling of the magnetic influence. E.g. the number of windings of the first and second conductors are equal, so as to provide a 1:1 voltage transformation.

Figure 4:
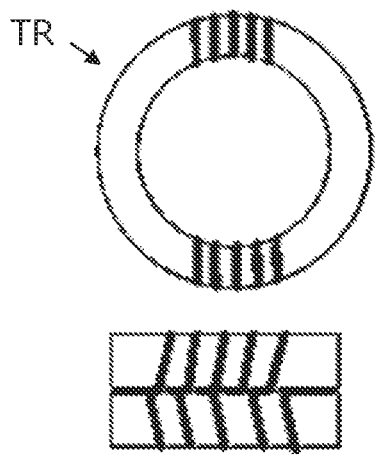
FIGS. 4 and 5 illustrate embodiments of the transformer.

FIG. 4 shows an embodiment of the two toroid principle from FIG. 3 in a top view (upper part) and a side view (lower part). In this configuration, two identical toroids are stacked, i.e. mounted on top of each other so that the openings of their closed loops coincide.

Figure 5:
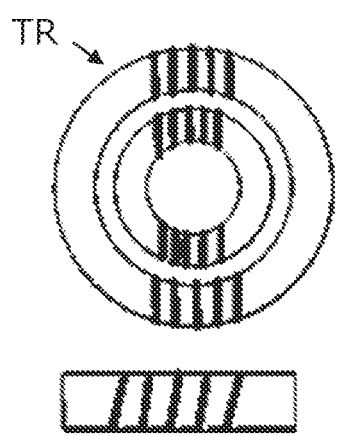

FIG. 5 shows another embodiment of the two toroid principle from FIG. 3 in a top view (upper part) and a side view (lower part). In this configuration, two toroids of different size are used as the first and second core, and the first core is positioned inside the closed loop of the second core.

It is to be understood that various other shapes of the two cores can be envisaged, e.g. rectangular or square shaped cores, and their relative positions can also be different from those shown in FIGS. 3-5.

Figure 6:
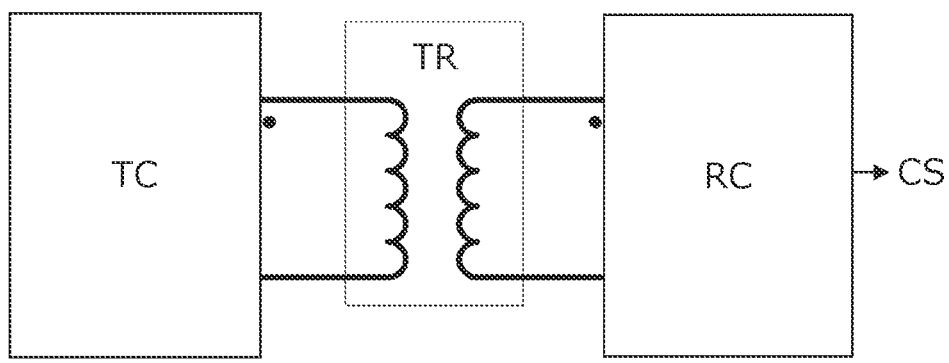
FIG. 6 illustrates a gatedriver circuit embodiment.

FIG. 6 shows a gatedriver circuit comprising a transmitter circuit TC and a receiver circuit RC with the transformer TR connected in between so as to provide a galvanic separation between the transmitter and receiver circuit. The receiver circuit generates the electric control signal CS in response to the signal received from the transformer TR, and the control signal CS can be applied to control a power electronic switch, e.g. switches of an IGBT module in an electric converter.

Figure 7:
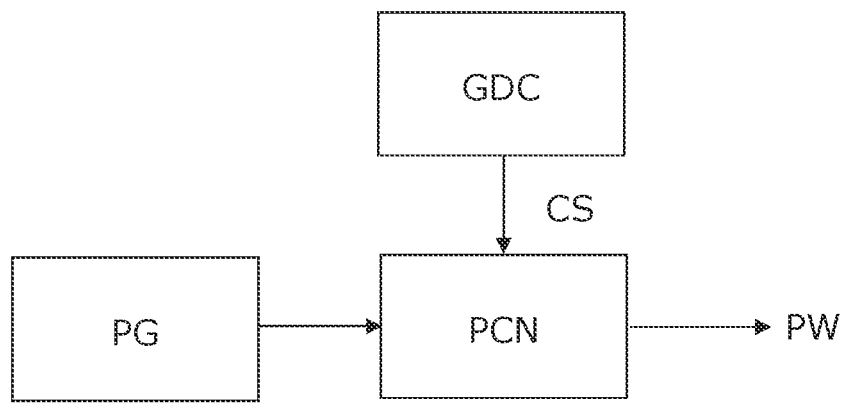
FIG. 7 illustrates an electric power converter system.

FIG. 7 illustrates an electric power converter system with a gatedriver circuit GDC of the invention. The gatedriver circuit GDC generates a control signal CS to control switching of the power electronic switches of an electric power converter PCN. The electric power converter PCN serves to convert electric power from an electric power generator PG. The power converter PCN generates an electric power output PW e.g. for application to the public electric network, in case of a wind turbine.

Figure 8:
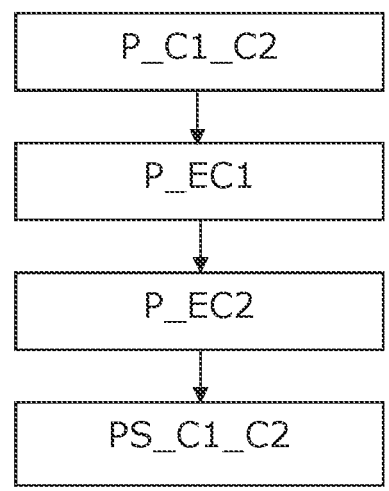
FIG. 8 illustrates steps of a method embodiment.

FIG. 8 illustrates steps of an embodiment of a method for providing a galvanic separation of an electric gatedriver control signal for controlling switching of a power electronic switch. The method comprises providing a transformer to receive an electric control signal at its electric input and to transform the electric control signal to the electric control signal output at its electric output.

The providing of the transformer comprises providing separate first and second cores P_C1_C2 of magnetically conductive material, wherein each of the first and second cores are shaped to form respective closed loops. Further, providing a first electrical conductor P_EC1 forming the electric input, wherein the first electrical conductor has at least one winding arranged around a part of the first core and at least one winding arranged around a part of the second core. Further, providing a second electrical conductor P_EC2 forming the electric output, wherein the second electrical conductor has at least one winding arranged around a part of the first core and at least one winding arranged around a part of the second core. Next, positioning PS_C1_C2 the first core in relation to the second core so as to allow mutual magnetic interaction between the first and second cores, and wherein the windings of the first and second electrical conductors around the first core have the same winding direction, and wherein the windings of the first and second electrical conductors around the second core have opposite winding direction of the windings of the first and second electrical conductors around the first core, so as to counteract electric influence induced by a common magnetic field through the closed loops of the first and second cores.

To sum up: embodiments of the invention provide a gatedriver circuit for controlling a power electronic switch. The circuit provides a galvanic separation and is magnetically immune. The gatedriver circuit comprises a transformer arranged with two separate cores of magnetically conductive material each forming a closed loop. A first electrical conductor has windings around a part of both cores, and a second electrical conductor also has windings around part of both cores. The two cores are positioned close to each other to allow mutual magnetic interaction. The windings of the first and second electrical conductors around the first core have the same winding direction, and the windings of the first and second electrical conductors around the second core have opposite winding direction of the windings of the first and second electrical conductors around the first core, so as to counteract electric influence induced by a common magnetic field through the closed loops of the first and second cores. Hereby, such gatedriver circuit is suitable for controlling power switches in environments with strong magnetic fields, e.g. inside a high power wind turbine.

Although the present invention has been described in connection with the specified embodiments, it should not be construed as being in any way limited to the presented examples. The scope of the present invention is to be interpreted in the light of the accompanying claim set. In the context of the claims, the terms "including" or "includes" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

What is claimed is:

1. An electric power converter comprising a plurality of power electronic switches and an electric gatedriver circuit arranged to generate an electric control signal output for controlling switching of the plurality of power electronic switches, the electric gatedriver circuit comprising a transformer arranged to receive an electric control signal at an electric input of the transformer and to transform the electric control signal to the electric control signal output at an electric output of the transformer, wherein the transformer provides a galvanic separation between the electric input and the electric output, and wherein the transformer comprises:
   separate first and second cores of magnetically conductive material, wherein each of the first and second cores are shaped to form respective closed loops;
   a first electrical conductor forming the electric input, wherein the first electrical conductor has at least one winding arranged around a part of the first core in a first winding direction and at least one winding arranged around a part of the second core in a second winding direction opposite the first winding direction; and
   a second electrical conductor forming the electric output, wherein the second electrical conductor has at least one winding arranged around a part of the first core in the first winding direction and at least one winding arranged around a part of the second core in the second winding direction so as to counteract electric influence induced by a common magnetic field through the closed loops of the first and second cores, wherein the first core is positioned in relation to the second core so as to allow mutual magnetic interaction between the first and second cores.

2. The electric power converter of claim 1, wherein the first core has a toroid shape.

3. The electric power converter of claim 1, wherein the second core has a toroid shape.

4. The electric power converter of claim 1, wherein the first core is positioned inside the closed loop of the second core.

5. The electric power converter of claim 1, wherein the first and second cores are positioned on top of each other to form a stack.

6. The electric power converter of claim 1, further comprising a transmitter circuit connected to the first electrical conductor and a receiver circuit connected to the second electrical conductor.

7. The electric power converter of claim 6, wherein the transmitter circuit is arranged to generate an electric control signal with a frequency within an interval of 10 KHz to 5 MHz.

8. The electric power converter of claim 1, wherein the first and second cores are made of a ferrite material.

9. The electric power converter of claim 1, wherein the first electrical conductor has 2-50 windings arranged around a part of the first core and 2-50 windings arranged around a part of the second core.

10. The electric power converter of claim 1, wherein the second electrical conductor has 2-50 windings arranged around a part of the first core and 2-50 windings arranged around a part of the second core.

11. The electric power converter of claim 1, wherein the transformer provides a voltage transformation ratio of 0.5 to 2.0 from the electric input to the electric output.

* * * * *